United States Patent [19]

Bleil

[11] Patent Number: 4,749,438

[45] Date of Patent: Jun. 7, 1988

[54] METHOD AND APPARATUS FOR ZONE RECRYSTALLIZATION

[76] Inventor: Carl E. Bleil, 132 Chalmers Dr., Rochester, Mich. 48063

[21] Appl. No.: 816,424

[22] Filed: Jan. 6, 1986

[51] Int. Cl.[4] .................. C30B 11/08; C30B 11/14
[52] U.S. Cl. .................. 156/620.1; 156/DIG. 88; 156/DIG. 91; 156/620.71
[58] Field of Search .......... 156/616 R, 617 R, 617 H, 156/620, DIG. 88, DIG. 91; 422/249

[56] References Cited

U.S. PATENT DOCUMENTS

| | | | |
|---|---|---|---|
| 2,415,025 | 1/1947 | Grell et al. | 156/620 |
| 3,378,409 | 4/1968 | Hurle et al. | 156/620 |
| 3,681,033 | 8/1972 | Bleil | 422/249 |
| 3,759,671 | 9/1973 | Bleil | 422/249 |
| 4,226,834 | 10/1980 | Shudo et al. | 422/249 |
| 4,264,407 | 4/1981 | Shudo et al. | 156/617 SP |
| 4,316,764 | 2/1982 | Kudo et al. | 156/617 H |
| 4,325,777 | 4/1982 | Yarwood et al. | 156/620 |
| 4,417,944 | 11/1983 | Jewett | 156/608 |
| 4,563,976 | 1/1986 | Foell et al. | 156/617 H |

FOREIGN PATENT DOCUMENTS 58-147024  9/1983  Japan ................... 156/617 R

OTHER PUBLICATIONS

Okamoto et al., "Current-Assisted Laser Annealing of Polysilicon Films," Applied Physics Letters, vol. 42, pp. 809–811, 1 May 1983.

*Primary Examiner*—John Doll
*Assistant Examiner*—Robert M. Kunemund
*Attorney, Agent, or Firm*—Seed and Berry

[57] ABSTRACT

A method and apparatus for producing crystalline ribbons by zone melting. Means for coupling electromagnetic energy into a film of material are provided to appropriately induce electrical currents in order to control and restrict the molten zone and suppress net loss of the heat of fusion from the balance of the ribbon in contact with the melt, thus controlling the thickness uniformity of the resulting ribbon. The heat of crystallization is selectively removed by a heat absorbing means from one end of the melt zone in a direction substantially perpendicular to the direction of pulling.

11 Claims, 6 Drawing Sheets

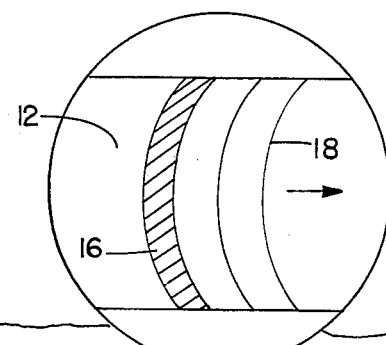
FIG.3
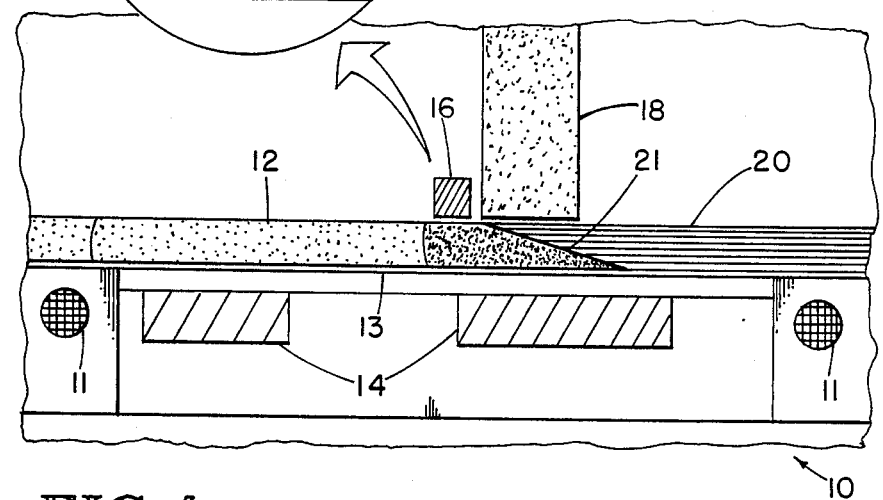
FIG.4
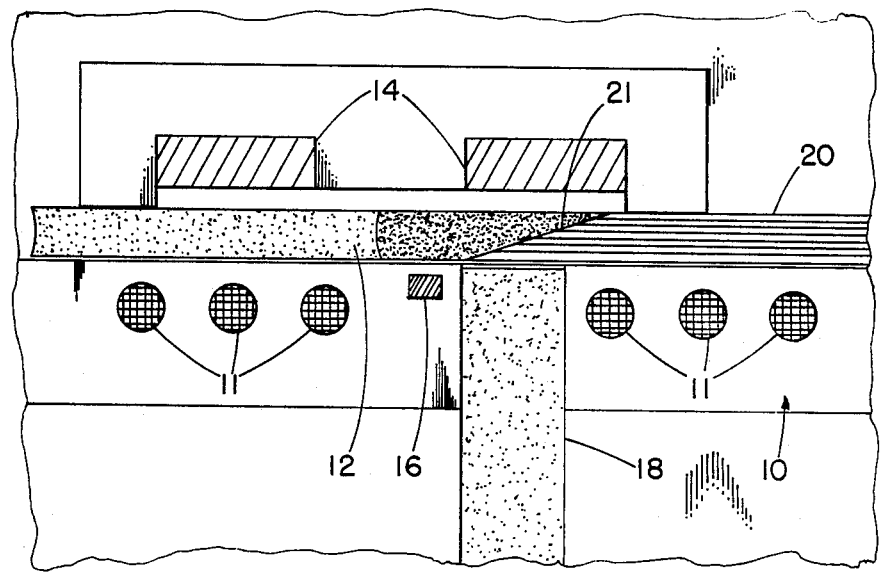

METHOD AND APPARATUS FOR ZONE RECRYSTALLIZATION

FIELD OF THE INVENTION

The method and apparatus described relates to the production of crystalline ribbons by zone melting. More particularly it relates to a method and apparatus for coupling electromagnetic energy into a thin film of material in order to raise the temperature of the material to nearly its melting point except along a specific narrow region zone where the material is caused to melt.

BACKGROUND OF THE INVENTION

There is a need for thin crystalline ribbons and films of many materials such as silicon and other semiconductors. These ribbons are often very costly and difficult to produce. For example, thin wafers of monocrystalline semiconductor materials are generally produced from monocrystalline boules grown by the Czochralski technique. The preparation of the thin wafers from large crystal boules requires slicing and polishing, is a costly and time consuming technique, and includes an inherent waste of much of the boule. Consequently, much effort has been directed toward growing thin monocrystalline ribbons that need only be scribed and broken to be used.

As reported, for example, by Chalmers, LaBelle, and Mlavsky in "Edge-Defined Film-Fed Growth," Journal of Crystal Growth, vol. 13/14, pp. 84-87, 1972, thin ribbons of semiconductors and insulators have been grown through elongated openings in a melt cover and/or with guide posts. In these latter techniques the crystal is pulled in a direction perpendicular to the surface of the melt using the geometric properties of a slot in the melt cover or guide posts to establish the transverse cross section of the resulting ribbon. However, satisfactory larger ribbon widths of appropriate thickness are produced only slowly and with reduced commercial advantage. This is because the probability of grain-boundary defects is proportional to the square root of the pull velocity, as confirmed by Pfeiffer, et al., in "Pattern Formation Resulting from Faceted Growth in Zone-melted Thin Films," Physical Review Abstracts, vol. 16, No. 10, May 15, 1985.

Ribbons of semiconductors have also been produced by pulling substantially in a horizontal plane from a melt surface, as disclosed by Bleil in U.S. Pat. Nos. 3,681,033 and 3,759,671. This technique produces ribbons much faster than the previous methods. However, pulling a ribbon too quickly or at too great an angle from horizontal introduces grain boundaries and imperfections which degrade the performance of circuitry placed on the semiconductor surface. This fact has been described in detail in U.S. Pat. Nos. by Jewett 4,289,571 and Kudo in 4,329,195. Moreover, the necessary controls to implement the process and produce very thin crystal ribbons and films of good quality are difficult to manage and thus the commercial advantage is reduced.

It has also been proposed to horizontally produce flat ribbons by zone melting techniques. This has been described by Geis et al. in "Materials Research Society Symposium," vol. 13, p. 477, 1983, and Omachi et al., "Ge-Seeded Crystallization on $SiO_2$ by Using a Slider System with RF Heated Strip Heater," Electronics Letters, vol. 19, No. 8, Apr. 14, 1983. However, such techniques develop freezing isotherms nearly perpendicular to the pulling direction and have not been wholly satisfactory for producing thin ribbons of high quality at low cost. Such difficulties may be avoided or corrected by recrystallization, according to this invention. Other ribbons or films may be similarly zone recrystallized.

In some applications, it is desirable to prepare monocrystalline films or semiconductor or other materials on an insulator substrate such as semiconductor on insulator, or SOI, structures. This can be accomplished by depositing powders, polycrystalline, or amorphous films of materials on an insulator material and then subjecting the film material to a zone recrystallization step. The desired monocrystalline structure can be given to the film material through a variety of "seeding" techniques, including beginning and maintaining the seeding process at a location away from the insulator material, thereby inducing a monocrystalline form over the insulating material or causing the desired crystal structure to be propagated through the ribbon cross section.

For ribbons or SOI structures, a variety of methods for supplying the zone-melting energy have been used, including lasers and graphite heaters with energy-focusing means. Methods for inducing electrical currents in the semiconductor and other materials, by exposing them to a high frequency electric field, have been used to recrystallize the cylindrical boules in a particularly energy efficient manner. However, induction methods have not been applied to ribbons because of the inability to control the shape and size of the zone of recrystallization. It is desirable to use current induction to cause zone recrystallization in a thin layer of semiconductor and other materials in a manner allowing the shape and size of the zone to be controlled.

SUMMARY OF THE INVENTION

I have discovered that through proper placement of appropriately shaped electrodes near the surface of a thin layer of material which exhibits sufficient electrical conductivity near its melting point, heating by means of induced electrical currents can produce desirable recrystallization zone sizes and shapes. Generally, in accordance with this discovery, two sets of sheet electrodes are used. A first set of electrodes, near the surface of the ribbon and separated in the pulling direction, induces electrical currents, within a specific portion of the ribbon, that are sufficient to raise the material to very nearly its melting temperature. A second pair of electrodes induce enough additional currents to cause a narrow region within the specific portion of the material to melt along a very narrow stable zone perpendicular to the pulling direction. Proper control of the two currents induced, in coordination with means for removing the heat supplied by the induction currents, allows the recrystallization to take place in a desired fashion, at an acceptably high rate.

According to one aspect of the invention, there is provided an apparatus for forming a crystalline ribbon-like body from a substantially planar shaped material comprising heating means for coupling electromagnetic energy into the material to induce electrical currents and cause the material to melt along a relatively narrow region within the material, means for causing relative motion between the material and the heating means, and means for controllably removing heat from the melted material in a direction substantially perpendicular to the plane of the material.

In accordance with a preferred embodiment of the invention, there is provided an apparatus for forming a ribbon of crystalline material, comprising first heating means for coupling electromagnetic energy into a film of material to induce electrical currents which cause the film to attain a temperature very near its melting temperature without melting the film, second heating means for coupling electromagnetic energy into the film to induce electrical currents causing the material to melt along a relatively narrow region transverse to a predetermined pulling direction, means for causing relative motion between the film and the first and second heating means, and means for controllably removing heat from the melted material in a direction substantially perpendicular to the plane of the film. The film of material may include a seed of monocrystalline material and the first heating means can comprise a pair of substantially parallel electrodes spaced apart in the pulling direction, slightly spaced away from the plane of the film, and connected to a source of alternating voltage.

A variety of configurations for the second inductive heating means are possible, including 1) two sets of colinear interdigitated electrodes coplanar with, or parallel to and on the opposite side of the film from, the first heating means, and located between the two electrodes of the first heating means and 2) a pair of substantially parallel electrodes, coplanar with, or parallel to and on the opposite side of the ribbon from, the first inductive heating means and spaced apart in the pulling direction. The first and second heating means are connected to independent rf voltage sources.

An alternative high-frequency voltage heating means comprises three parallel electrodes spaced apart in the pulling direction with a first high-frequency voltage source connected between first and second electrodes and a second high frequency voltage source connected between the second and third electrodes. The two voltage sources operate at slightly different frequencies. The three electrodes may be on the same or different sides of the ribbon.

A method in accordance with the invention for forming a crystalline ribbon of material from a substantially planar film of material comprises the steps of coupling electromagnetic energy into the material to induce electrical currents in the material and cause at least a portion of the material to attain a temperature near the material'3 s melting temperature while the material remains a solid, further heating the portion of the material which has attained a temperature near its melting point, causing the material to melt along a relatively narrow region, causing relative motion in a predetermined direction between the material and the heating means, and controllably removing heat from the melted material in a direction substantially perpendicular to the plane of the material.

BRIEF DESCRIPTION OF THE DRAWINGS

FIG. 1 shows the normal configuration and FIG. 2 shows an inverted configuration; the inset in FIG. 1 details the secondary heat source structure;

FIGS. 3 and 4 are enlarged framentary elevational views of the melt-seed-heat sink contact region of the apparatus shown respectively in FIGS. 1 and 2;

DESCRIPTION OF THE PREFERRED EMBODIMENT

Figure 1:
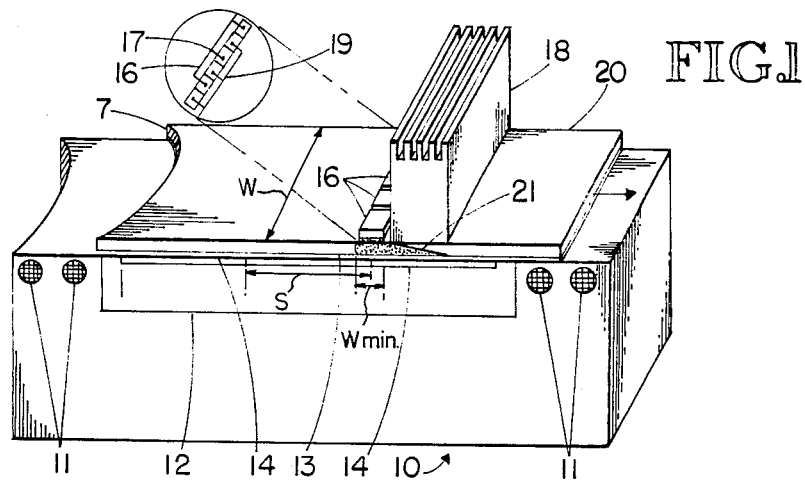
FIGS. 1 and 2 are exaggerated isometric views in partial section of the melt area of a zone-melt growing apparatus provided with a secondary heat source and heat sink for horizontal crystal growing in accordance with the invention.

A better appreciation of the various aspects of the invention may be gained by reference to the figures of the drawings. Principal features of the invention lie in the localized application of heat to a film of material, the selective removal of heat in a direction perpendicular to the pulling direction at one end of the melt zone, and the suppression of the loss of the heat of fusion from the balance of the material film. The heat is applied locally by inducing electrical currents between relatively closely spaced electrodes, melting the film in a narrow zone. A heat sink in physical contact with the ribbon can be used to selectively remove the heat of crystallization from the selected end of the growing ribbon as shown in FIGS. 1–8, 10 and 12-13. On the other hand, the heat can be removed by simply allowing it to radiate to the ambient or by use of cooling gases as shown in FIGS. 9 and 11, respectively. The end of the ribbon where the heat is lost becomes the seed end of the growing ribbon.

The melt zone is suppressed in the balance of the ribbon by controlling the current from primary and secondary electrodes. The melt zone is confined and stabilized, when required, with the secondary electrodes to be within the heated zone defined by the primary electrodes. Growth rate can be suppressed by reducing the rate of heat loss of the heat of fusion. This can be done by controlling the secondary heat source and/or the selective heat sink.

A special heater may replace the loss of the heat of fusion, or a heat reflector may reduce the loss of the heat of fusion. If there is any actual loss of the heat of fusion, it is replaced by a heat source other than the melt itself. Hence, the heaters and/or heat reflectors, along with the selective heat sink, establish a freezing isotherm between the growing ribbon and the melt that is determined in part by the selected ribbon width and thickness.

Because the probability of generating dislocations in a growing crystal is nearly proportional to the square root of the growth velocity, it is important to keep the growth velocity low even while maintaining a high pulling rate. This is accomplished by keeping the freezing isotherm as close to parallel to the pulling direction as practical. Angles less than 10° are desired.

When the growing ribbon is pulled substantially parallel to the direction of the current induced by the primary electrodes, the molten zone and recrystallization may be distorted in the direction of pulling but remains substantially fixed in space as a narrow region of closely controlled crystal growth. Unlike other systems for zone recrystallization, the principal regrowth direction in this embodiment occurs substantially perpendicular to the pulling direction, except at the tip of the growing ribbon.

The surface of the growing ribbon facing the selective heat absorber and the surface of the molten zone should be coplanar, at least adjacent to the growing tip of the ribbon. The growing tip is the intersection of the freezing isotherm with the surface facing the heat sink.

The growing tip can be made coplanar with the adjacent melt surface by making the entire ribbon coplanar with the surface of the molten zone. The surface tension of the material can maintain this coplanarity. It can also be done by using a separate contact element that is wetted by, but does not contaminate the melt, to again allow the surface tension forces to maintain the ribbon melt coplanarity at the tip. I prefer to use both principles where appropriate to the desired goal.

The new growth on the ribbon may tend to adhere to the heat sink removing means, depending on the material. The crystal can be prevented from adhering to the contacting surface of the heat sink if there is no strong reaction between their contacting surfaces near the crystal melting point. If crystal-heat sink adherence is a problem, an interface (such as tungsten coated stainless steel substrate or an oxide coating in the ease of a silicon ribbon) may be used between the ribbon and the heat sink, and/or nucleation of the crystal must be induced away from the heat sink. This can be readily accomplished by adjusting the spacing of the primary electrodes and/or the positioning of the secondary heat source and the selective heat sink, pulling the ribbon at the appropriate rate, or adjusting the rate of nucleation to substantially maintain this spacing during growth. Moreover, heat removal may be accomplished by radiative cooling or by convective or conductive cooling by an inert gas such as argon or helium, thus avoiding heat sink adherence or contamination.

Of course, the usual precautions pertaining to the choice of materials, ambient atmosphere, vibrationfree environment and other routine growth conditions, well-known to those skilled in the art, should be observed with this invention, just as they would in the usual zone melting and crystal growing techniques.

For the implementation of the invention several additional factors must be considered. It is noted that the invention applies equally well to many metals and semiconductors and certain insulators that exhibit significant electrical conductivity near their melting point. Most materials will show measurable changes in their density, surface energy, electrical and thermal conductivity as they undergo the phase change from solid to liquid at their melting temperature.

Figure 2:
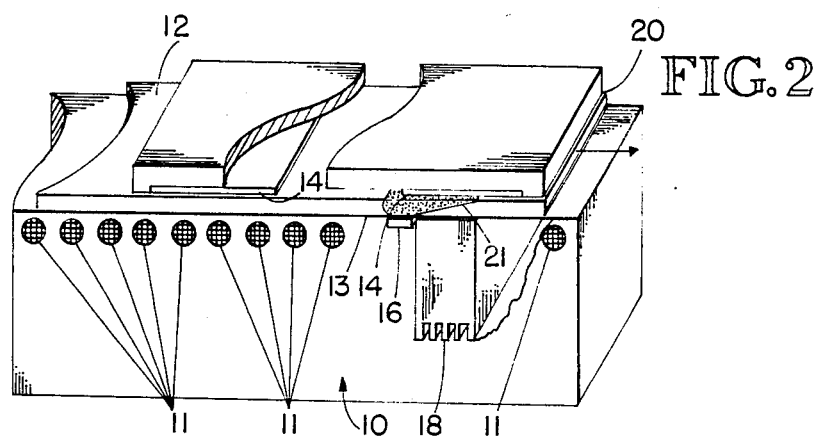

The particular embodiment of this invention to be used for a particular ribbon material will depend on the property changes mentioned above. For materials, such as silicon, whose electrical conductivity is greater in the melt than in the solid, it is prudent to use an embodiment that stabilizes the melt against small local fluctuations in the electrical resistance as shown in FIG. 1 and 2. Lack of stability can lead to disruptive melt zones and irregular regrowth.

Figure 12:
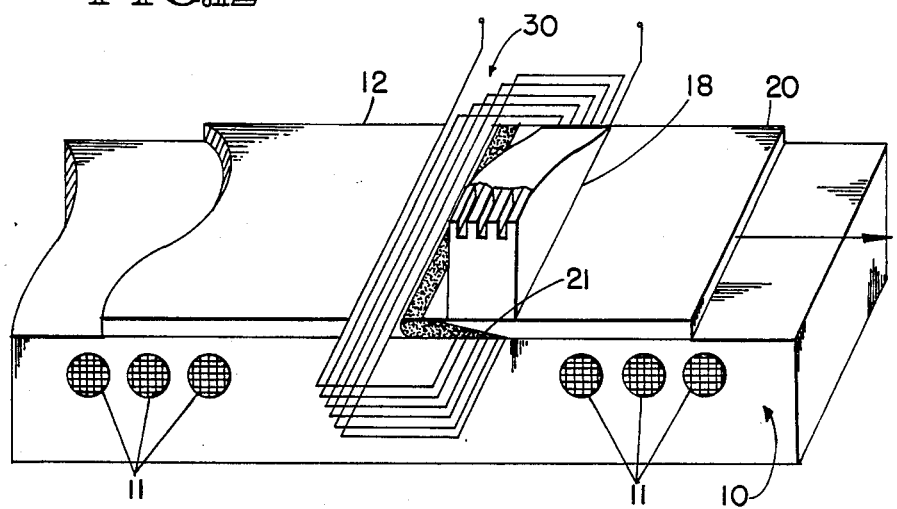
FIG. 12 is an enlarged fragmentary elevational view of a modification providing for the induction of eddy currents across the width of the ribbon substantially perpendicular to the pulling direction.

Another embodiment for materials of this type is shown in FIG. 12. In this case a single electrode configuration 30 induces an eddy current in a narrow zone in which the current flows across the width of the ribbon in a direction substantially perpendicular to the pulling direction. The result of each of the above embodiments is to confine and stabilize the molten zone.

Figure 7:
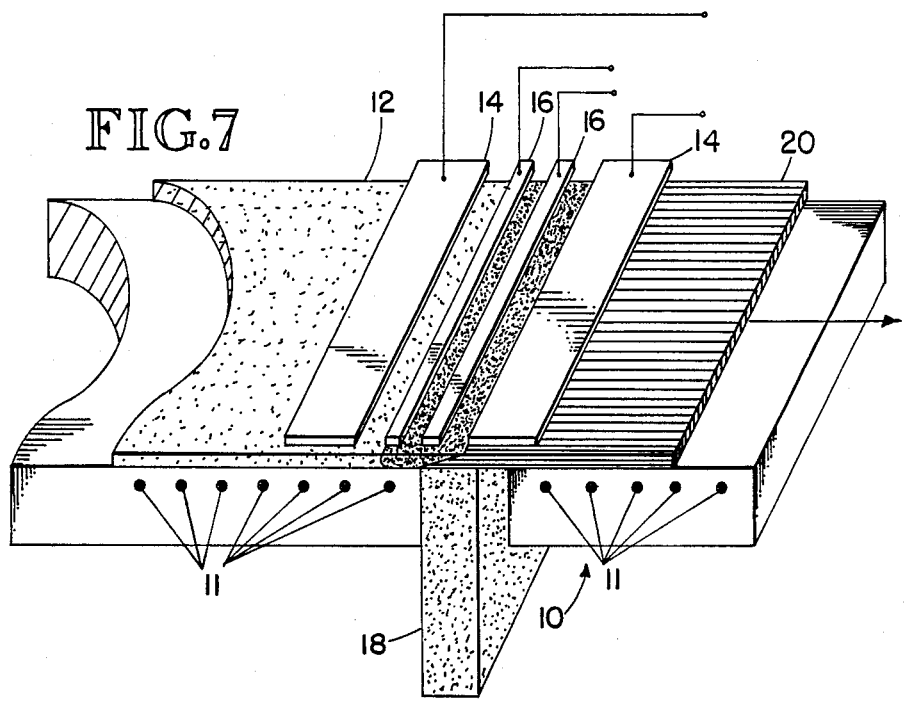
FIG. 7 is an enlarged fragmentary isometric view of a modification of the apparatus shown in FIG. 2 in which two electrodes oriented parallel to the principal electrodes and separated along their greater length are used for the secondary heat source.

For materials, such as bismuth and many metals, where the conductivity of the solid is significantly larger than the liquid at the melting point, it may be convenient to use an electrode configuration as shown in FIG. 7 or as shown in FIGS. 1 and 2 with or without the secondary electrode.

Figure 13:
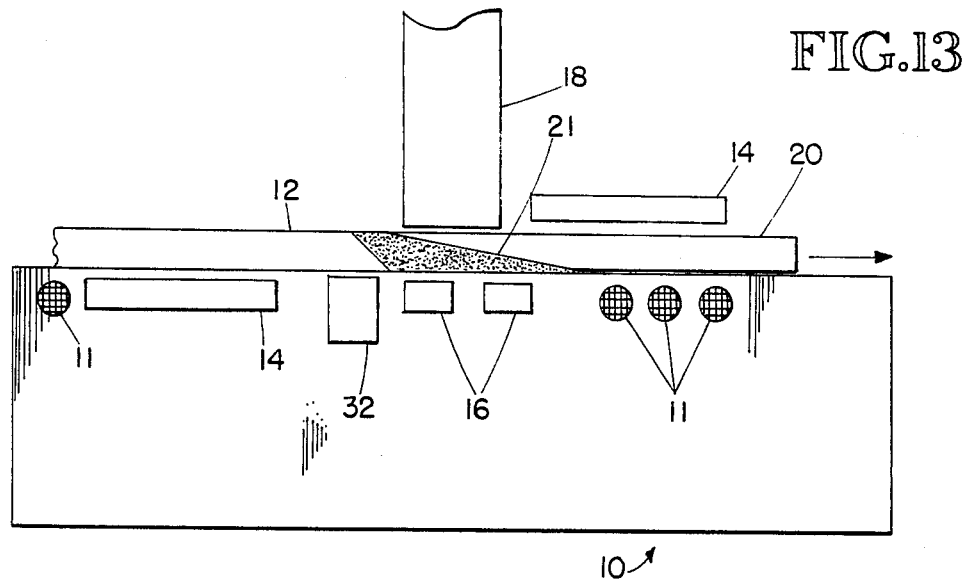
FIG. 13 is an exaggerated elevational view of another electrode configuration in which the primary electrodes are parallel but on opposite sides of the ribbon, and a special ancillary heat source is also shown.

Still another electrode configuration for this class of materials is represented by the placement of the primary electrodes on opposite sides of the ribbon as shown in FIG. 13. For special cases dictated by the material properties, a second heat sink may be desired to control the shape of the melt zone and the angle of the freezing isotherm relative to the pulling direction. For materials of this type the molten zone is automatically stabilized with regard to local variations is electrical conductivity and will remain between the electrodes.

For the two types of ribbons above (e.g. silicon or bismuth) it is also necessary to consider the ratio of the surface energy to the density at and above the melting point. Silicon exhibits a very large surface energy-to-density ratio as compared to bismuth. The result of this property is that the least width of a stable silicon melt zone as shown in FIGS. 1 and 2 (horizontal growth) will be much smaller than that for bismuth. For the case of silicon ribbon less than 500$\mu$ thick the least width of the molten zone is comparable to the ribbon thickness whereas, for bismuth, least widths five times the thickness have been observed. This parameter may be relaxed when the ribbon is made to adhere to a solid substrate. Silicon films 0.5 mm thick on a quartz substrate have been shown to support a stable melt zone 2 mm wide.

In addition to the above it is known that silicon, for example, exhibits a significant increase in its thermal conductivity as it passes from the solid to the liquid state. Such changes as this can alter the central point for the applied voltages to the primary and secondary electrodes as well as the control temperature and thermal profile for the heat sink. These parameters may be separately adjusted during processing as well as the electrodes spacings, relative to the ribbon, the heat sink, and to each other.

For simplicity, the subsequent discussion will be restricted to one ribbon material, i.e. silicon.

FIGS. 1 and 2 show the melt zone area of a silicon crystal ribbon growing apparatus made in accordance with the invention. To focus attention on the improvements this invention presents, the ancillary features normally incident to zone melting crystal growth apparatus, such as a housing and support means for producing a protective environment, heater power supplies, pulling apparatus, and the like, are not shown. However, for example, the apparatus would involve heating power supplies, a controlled pulling system, a means for precision positioning of the electrode ensembles, a regulated atmosphere environment, temperature monitoring, etc.

In the areas of the crystal growing apparatus within which the principal processing will occur, a heated platform 10 with heaters 11 is provided on which is placed a film of amorphous or polycrystalline silicon 12. The film 12 can be placed on a thin substrate 13 made, for example, of an electrically insulating material, depending upon the application for which recrystallized film 12 is intended. It will be understood by those skilled in the art that some applications will not require or use a substrate 13. The film can typically be 100μ thick. The film is pulled toward the right in FIG. 1. The platform is typically four inches wide and four feet long although the method and apparatus of the present invention work regardless of these dimensions. In the central processing region, two principal sheet electrodes 14, mutually coplanar and parallel and extending the full width of the film 12, are positioned in close proximity to the film 12 with an interelectrode space s along the greater length of the electrodes. The electrodes are each 15 mm wide, 100 mm long and 0.10 mm thick. They are spaced 2.0 mm apart along their greater length and positioned about 0.020 mm from the ribbon 12. Some of these dimensions are exaggerated in FIG. 1 to make certain features of the apparatus more apparent. The principal electrodes will provide the rf resistance heating in this 32 mm region.

In the region between the principal electrodes 14, two sets of secondary sheet electrodes 16 are placed to provide the additional localized heating required to cause stable melting within the heated zone. These electrodes are 0.10 mm wide, collectively 100 mm long and individual electrodes are spaced apart 0.20 mm. They are substantially parallel to the principal electrodes 14.

The members of one set of secondary electrodes alternate, or are interdigitated, with members of the other set. As shown in the inset of FIG. 1, the members of each of these two sets are electrically connected through wires 17 and 19, respectively. By connecting a high-frequency voltage source between wires 17 and 19, the desired narrow molten zone is created. The frequency of the electrical voltage applied to the secondary electrodes may differ from that of the primary electrodes, depending on the material and the electrode geometry. For the dimensions given above, an appropriate frequency for the primary electrodes will be approximately 13.6 MHz. It will be understood by those skilled in the art that these dimensions may be varied in accordance with the heating requirements and the rf frequencies used. The molten zone produced by the secondary heat source 16 will preferably have its minimum width $W_{min}$ comparable to the film thickness.

The current induced in the heated region by the principal electrodes 14 will reach a maximum when the film temperature is near the melting point (1412° C.) for silicon but for which melting has not occurred. The initial resistance of the region between the principal electrodes 14 is lowered by means of the heated platform 10, if required, in order to allow them to function properly.

The melt zone will only exist when the secondary heater 16 provides and maintains at least a portion of the heat of fusion required for the selected melt volume. In this preferred embodiment the silicon film 12 is 100 mm wide and 0.10 mm thick. The molten zone is nominally 0.20 mm wide and 100 mm long (that is, the full width and thickness of the film).

Heat sink 18, for example, a heat pipe, extracts heat from the molten zone at a rate just sufficient to maintain the melt-crystal isotherm 21 in the heated region.

Extracting heat from one side of the film, positioning the secondary heat source near the heat sink, and providing primary heating from the other side promotes nucleation of crystalline silicon on the side of the heat sink in the direction opposite to the pulling direction, while principal growth continues substantially perpendicular to the pulling direction. That is, the melt-crystal isotherm 21 is substantially as shown in FIG. 2. In FIGS. 1 and 3 the nucleation occurs at the free surface of the melt, while in the inverted configurations of FIGS. 2 and 4, the nucleation occurs in the proximity of the substrate 13 if one is used.

Several techniques are available for initially seeding the crystal growth in the desired crystal orientation. After initial seeding, continuous seeding will be subsequently established by the growing crystal ribbon. In a preferred embodiment a seed 20 whose thickness and width are substantially the same as the ribbon (i.e. 100 mm wide and 0.10 mm thick) is selected (see any of the Figures). The length of the seed selected is commensurate with the needs of the crystal pulling attachment (not shown). The major faces of the selected seed are parallel and in the (111) plane when this orientation is desired. The seed is oriented so that the pulling will take place along the <211> direction. The end of the seed is coated with a predetermined thickness of a metal, such as gold or aluminum, to form a conducting contact which will also form a eutectic with silicon below the melting point of silicon. The coated seed is placed in the heated zone, in contact with the end of film 12 where a melting and resolidification will occur as pulling proceeds and the crystalline order of the seed lattice will be transferred to the newly grown ribbon. Contact of the seed with the film is made prior to processing in the heated zone.

Other techniques, well-known in the art, may also be used to provide initial seeding for each growth as required. For example, a simple bevel overlap of a seed with the film in the melt zone may be used or a single crystal growth may be gated by necking down the ribbon width one or more times to eliminate alternative crystal orientations.

FIGS. 3-7 show modifications of the apparatus illustrated in connection with FIGS. 1 and 2. The modifications involve the construction of the heat sink used to selectively remove heat from the growing ribbon (or seed) and the nature of the special heat source used to maintain the desired freezing isotherm within the molten zone.

Figure 5:
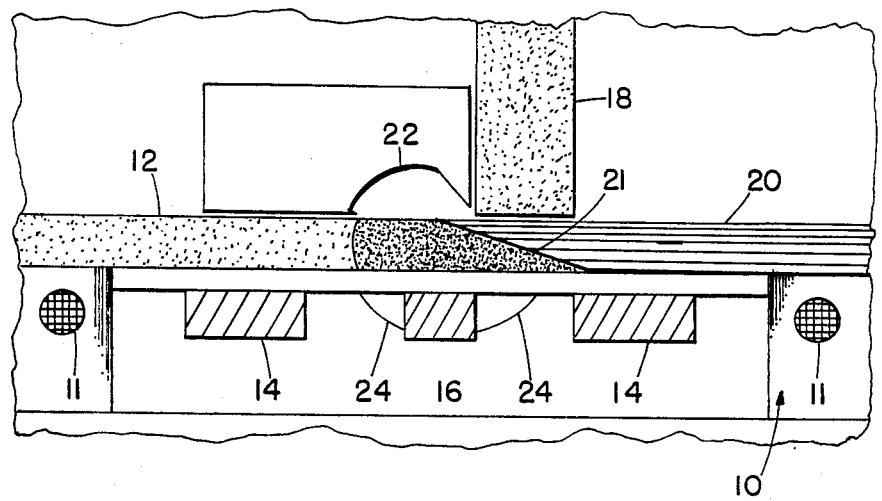
FIG. 5 is an elevational view in partial section of a modification of the apparatus of FIG. 1 in which the heat sink includes a heat reflector to aid in controlling the profile of the freezing isotherm.

In FIG. 5 reflectors are introduced to reduce the heat loss from the molten zone. The reflective properties, such as good infrared reflection, are used to return the energy radiated from the molten zone back into the molten zone. The upper reflector 22 directs heat from the upper surface of the molten zone back to the molten zone while lower reflector 24, positioned below the molten zone, reflects radiated heat upward toward the molten zone. The lower reflectors 24 are placed in concavities located on either side of secondary electrode 16, which, in this embodiment, is on the same side of the film as the primary electrode. The secondary electrode extends at least the full width of the ribbon.

Figure 6:
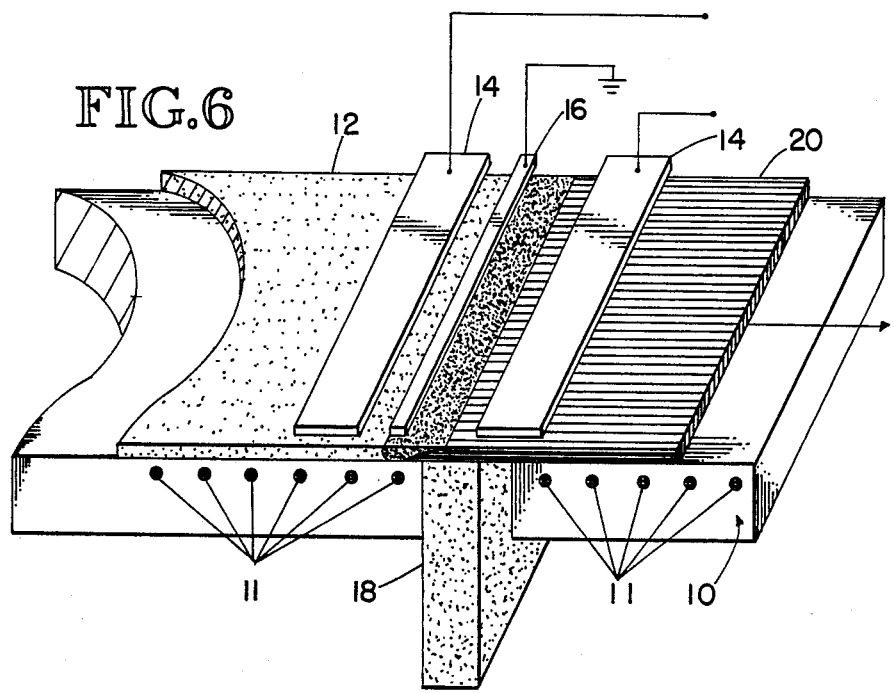
FIG. 6 is an enlarged fragmentary isometric view of a modification of the secondary heat source for the apparatus shown in FIG. 2 in which a single electrode is provided for the secondary source.

In FIG. 6 the heater comprises a special combination of primary and secondary electrodes 14 and 16 to achieve ribbon melting only in the region of the single central (secondary) electrode 16. To achieve this result voltages having slightly different of frequencies are applied to the outer electrodes, with the central electrode 16 grounded. Thus, when the two applied voltages are out of phase a current passes principally between the outer electrodes 14, while when they are in phase essentially no current passes between the outer electrodes and nearly twice the current passes to ground through the center electrode 16. Proper selection and control of the frequency difference, electrode size and spacing, and the applied voltage will selectively heat the area between the outer electrodes but only melt the region near the center electrode. In this configuration, heat can be removed from the lower surface by heat sink 28.

In FIG. 7 another embodiment of the secondary heat source incorporates two parallel electrodes with their separation along their greater length. This configuration is preferred when the melt exhibits a higher resistance than the solid of the material being processed and additional melt stability is required. The primary electrodes are connected to a first rf voltage source, while the secondary electrodes are connected to a second rf voltage source. By properly controlling the two voltage sources, the melt zone can be kept with in desirable limits.

Figure 8:
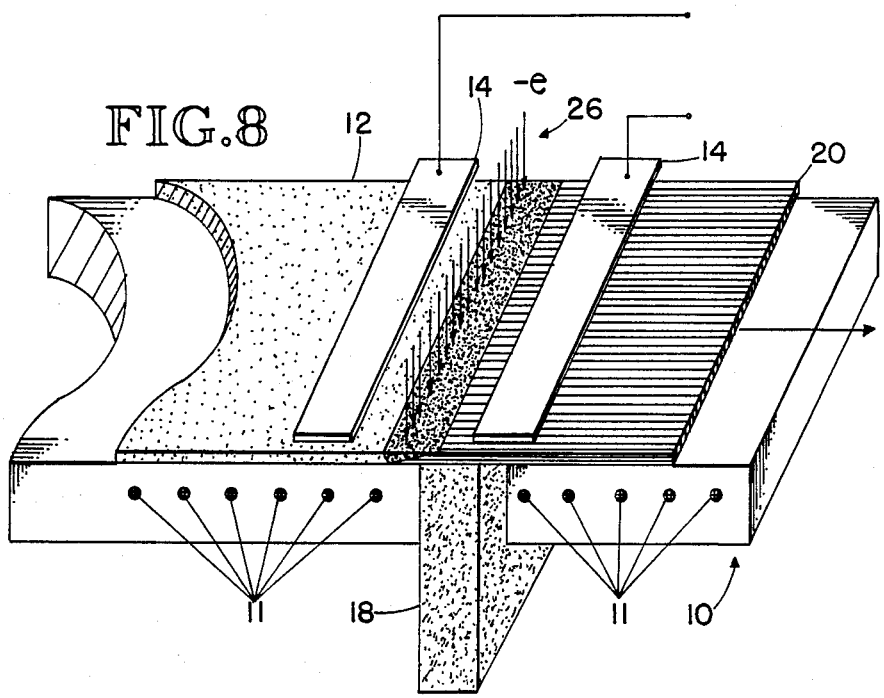
FIG. 8 is an enlarged fragmentary isometric view of a modification of the secondary heat source for the apparatus shown in FIG. 2 in which an ancillary heat source is provided.
Figure 9:
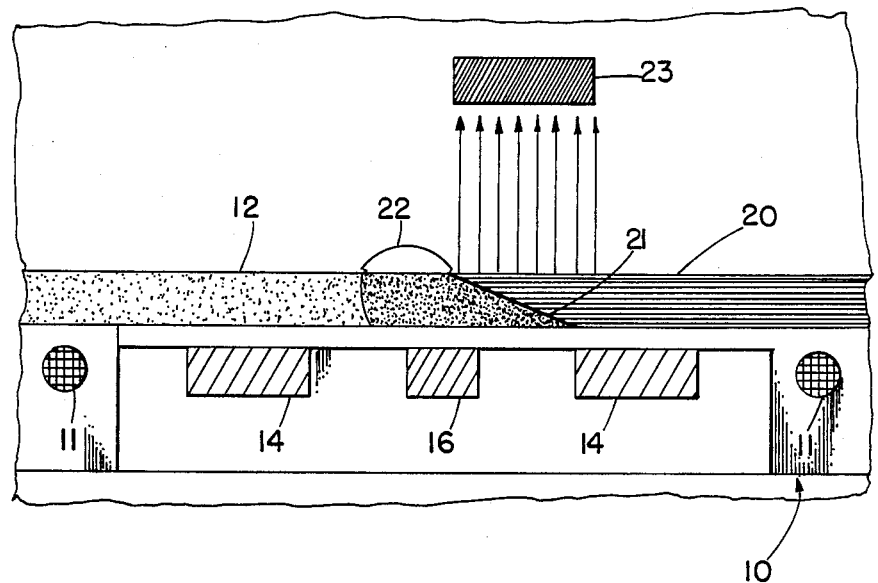
FIG. 9 is an enlarged fragmentary view of a modification of the selective heat sink of FIG. 5, to allow for radiative cooling.

In FIG. 8 an ancillary heating source 26 is used in place of the secondary heater shown in the preceding figures. Such a source might be an electron line source, as shown or any highly localized line source, such as a laser, to permit the molten zone to be confined in the heated region. In FIG. 8 ancillary heater 26 is shown on the opposite side of the film 12 from the heat sink 18, although in some embodiments, heat sink 18 and heater 26 can be on the same side.

In FIG. 9 the heat loss is achieved by radiative cooling to realize slow cooling and to avoid possible melt-heat sink contact. An upper reflector 22 retains heat reflected by the molten-zone, but the heat loss by the radiation process is accomplished by radiating to a non-contacting heat sink 28.

Figure 10:
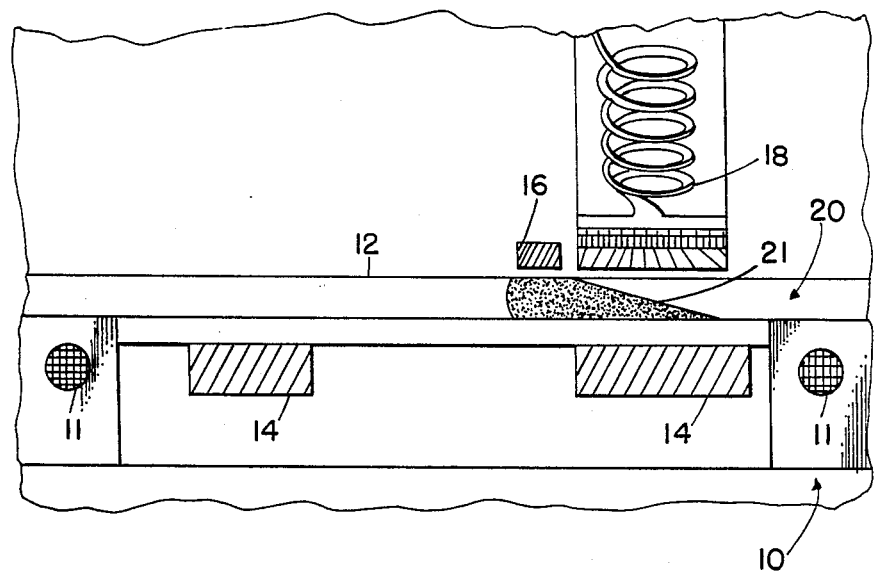
FIG. 10 is an exaggerated enlarged fragmentary view of a melt-seed-heat sink contact region of a further modification of the apparatus of FIG. 1, wherein the heat sink is provided by the passage of cooling inert gases over the ribbon.
Figure 11:
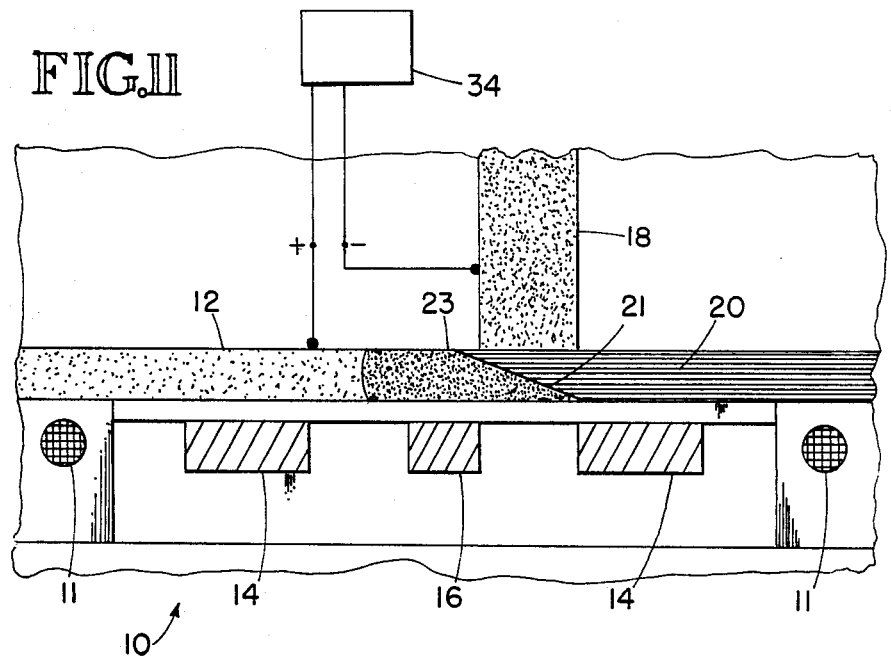
FIG. 11 is an enlarged framentary elevational view of a modification of the melt-seed-heat sink contact region of the apparatus shown in FIG. 1, introducing a DC electric field at the nucleating crystal tip.

FIG. 10 shows a modification of the apparatus of FIG. 1 wherein the heat loss is achieved by convective cooling with an inert gas such as argon or helium. A gas conductive cooling means using, for example, an inert gas with a high thermal conductivity, such as helium gas, is also applicable to this configuration.

In FIG. 11 a modification is used to assist in the control of the nucleation region. It consists of a bias DC voltage supply 34 which is applied to the film across the growing interface 21 to alter the local chemical potential in the vicinity of the growing ribbon interface 21. This DC potential enhances the nucleation at the apex 23 of the growth. In the embodiment shown, the highest field due to the applied DC voltage will appear at the tip of the growing crystal. While the DC voltage is shown applied in a certain direction, certain materials will require the opposite voltage.

In FIG. 12 a modification is shown that may be used for those film materials that exhibit an increase in electrical conductivity in the molten state but may be caused to melt by generating an eddy current across the ribbon substantially perpendicular to the pulling direction. The induced current in this case is produced by a multiplicity of turns around the film so that the plane of the coil 30 is nearly parallel to the film. The coil 30 extends beyond the edges of the film 12 so that the induced current will lie substantially in the plane of the ribbon and is perpendicular to the pulling direction. This figure also illustrates that for certain materials a secondary heating source may not be necessary at all. Any of the preceding figures can, of course, be operated without the secondary heating source 16, or the various embodiments shown can be built without the secondary heater. While all of the figures may suggest that the process applies only to horizontal pulling of the ribbon no such orientation constraint of the apparatus is envisioned. The constraints imposed by gravity will of course apply to heat pipes if they are to be used as a heat sink for the apparatus. Similar gravitational constraints may apply for dense materials with low surface energy such as bismuth or lead. Moreover, the figures suggest that the secondary electrodes are all nominally rectangular. This is not a constraint envisioned. In particular, in accordance with well known art, the secondary heat source 16 and the heat sink 18 may exhibit a curvature which is convex to the pulling direction so that the laterally central portion of the growing ribbon as well as the upper free surface (see the top view of FIG. 3) will exhibit nucleation and growth before the edges or the bottom of the ribbon. Such techniques are well known to improve the as-grown crystal quality.

FIG. 13 of the drawings illustrates that for such material as lead, although primary and secondary heaters are preferentially coplanar, it is not necessary that they be. FIG. 13 shows primary heaters 14 which are on opposite sides of film 12, and, therefore, not coplanar. This could, of course, be true even when the secondary heaters 16 are removed, or not used. In the case where primary electrodes are not coplanar, it may be desirable to have a second heat sink 32 in order to better control the profile of the melt zone in the film.

While all of the discussion in the above has been directed toward a method and apparatus for recrystallizing the processed material to a monocrystalline form, those skilled in the art will recognize that the method and apparatus of the present invention can be useful to generally increase the crystal grain size of the processed material.

It should be appreciated that although this invention has been described in connection with certain specific examples thereof, no limitation is intended thereby except as defined in the appended claims.

I claim:

1. A method for forming a crystalline ribbon of material from a substantially planar film of material, comprising the steps of:
coupling electromagnetic energy into the film of material by a primary heating means which induces electrical currents in the film of material and causes at least a portion of the material to attain a temperature near the material's melting temperature without melting the material by connecting a first source of radio frequency voltage between a first pair of electrodes, the electrodes being slightly spaced apart from one side of the film;

coupling additional electromagnetic energy from a secondary heating means into the portion of the film which has attained a temperature near its melting point, thereby inducing additional electrical currents in a relatively narrow region within the film and causing the material to melt along the relatively narrow region;

causing relative motion between the film of material and the primary and secondary heating means, the direction of relative motion being parallel to the plane of the film of material and perpendicular to the electrodes of the primary heating means; and controllably removing heat from the melted material in a direction substantially perpendicular to the plane of the film of material.

2. The method of forming a crystalline ribbon of material from a substantially planar film of material, comprising the steps of:

coupling electromagnetic energy into the film of material by a primary heating means which induces electrical currents in the film of material and causes at least a portion of the film to attain a temperature near the material's melting temperature without melting the material, by connecting a first source of high-frequency voltage between a pair of substantially parallel electrodes, the electrodes being slightly spaced apart from the plane of the film;

coupling additional electromagnetic energy into the film of material by a secondary heating means which induces additional electrical currents in the film of material and causes a portion of the film of material that has attained a temperature near its melting point to melt along a relatively narrow region within the film by connecting a second source of high-frequency voltage between two sets of colinear electrodes, parallel to and between the electrodes of the primary heating means with respect to the planar film of material;

causing relative motion between the film of material and the primary and secondary heating means, the direction of relative motion being parallel to the plane of the film of material and perpendicular to the electrodes of the primary and secondary heating means; and controllably removing heat from the melted material in a direction substantially perpendicular to the plane of the film of material.

3. The method of claim 2, further comprising the step of altering the chemical potential at the nucleating tip of the ribbon of crystalline material by attaching a fifth electrode to the means for removing heat and a sixth electrode to the film of material at a point where the film is solid, the point being directed away from the melted material in a direction opposite to the direction of motion of the film of material relative to the primary and secondary heating means, and connecting a dc voltage source between the fifth and sixth electrodes.

4. The method of forming a crystalline ribbon of material from a substantially planar film of material, comprising the steps of:

coupling electromagnetic energy into the film of material by a primary heating means which induces electrical currents in the film of material and cuases at least a portion of the film to attain a temperature near the material's melting temperature without melting the material, by connecting a first source of high-frequency voltage between a pair of substantially parallel coplanar electrodes, the electrodes being slightly spaced apart from the plane of the film;

coupling additional electromagnetic energy into the film of material by a secondary heating means which induces additional electrical currents in the film of material and causes a portion of the film of material that has attained a temperature near its melting point to melt along a relatively narrow region within the film by connecting a second source of high-frequency voltage between two substantially parallel electrodes, substantially parallel to and between the electrodes of the primary heating means with respect to the planar film of material;

causing relative motion between the film of material and the primary and secondary heating means, the direction of relative motion being parallel to the plane of the film of material and perpendicular to the electrodes of the primary and secondary heating means; and controllably removing heat from the melted material in a direction substantially perpendicular to the plane of the film of material.

5. A method for forming a crystalline ribbon of material from a substantially planar film of material including, at least at one end of the film, a seed of monocrystalline material, comprising the steps of:

coupling electromagnetic energy into the film of material by a heating means which induces electrical currents in the film of material by connecting first, second, and third substantially parallel electrodes, spaced apart from the film of material, to first and second high-frequency voltage sources, the two voltage sources operating at different frequencies, the first voltage source being connected between the first and second electrodes and the second voltage source connected between the second and third electrodes;

causing relative motion between the film of material and the heating means, the direction of relative motion being parallel to the plane of the film of material and perpendicular to the electrodes of the heating means; and controllably removing heat from the melted material in a direction substantially perpendicular to the plane of the film of material.

6. The method of claim 5 wherein the step of controllably removing heat from the melted material is accomplished by a heat pipe.

7. The method of claim 5 wherein the step of controllably removing heat from the melted material is accomplished by a stream of cooling gas.

8. The method of claim 1 wherein the step of controllably removing heat from the melted material is accomplished by a heat pipe.

9. The method of claim 1 wherein the step of controllably removing heat from the melted material is accomplished by a stream of cooling gas.

10. The method of forming a crystalline ribbon of material from a substantially planar film of material, comprising the steps of:

coupling electromagnetic energy into the film of material by a primary heating means which induces electrical currents in the film of material and causes at least a portion of the film to attain a temperature near the material's melting temperature without melting the material, by connecting a first source of high-frequency voltage between a pair of substantially parallel electrodes, the electrodes being slightly spaced apart from the plane of the film;

coupling additional electromagnetic energy into the film of material by a secondary heating means which induces additional electrical currents in the film of material and causes a portion of the film of material that has attained a temperature near its melting point to melt along a relatively narrow region within the film by connecting a second source of high-frequency voltage between two sets of colinear electrodes, parallel to and between the electrodes of the primary heating means with respect to the planar film of material;

causing relative motion between the film of material and the primary and secondary heating means, the direction of relative motion being parallel to the plane of the film of material and perpendicular to the electrodes of the primary and secondary heating means;

altering the chemical potential at the nucleating tip of the ribbon of crystalline material by attaching a fifth electrode to the means for removing heat and a sixth electrode to the film of material at a point where the film is solid, the point being directed away from the melted material in a direction opposite to the direction of motion of the film of material relative to the primary and secondary heating means, and a connecting a dc voltage source between the fifth and sixth electrodes; and controllably removing heat from the melted material in a direction substantially perpendicular to the plane of the film of material by means of a heat pipe.

11. The method of forming a crystalline ribbon of material from a substantially planar film of material, comprising the steps of:

coupling electromagnetic energy into the film of material by a primary heating means which induces electrical currents in the film of material and causes at least a portion of the film to attain a temperature near the material's melting temperature without melting the material, by connecting a first source of high-frequency voltage between a pair of substantially parallel electrodes, the electrodes being slightly spaced apart from the plane of the film;

coupling additional electromagnetic energy into the film of material by a secondary heating means which induces additional electrical currents in the film of material and causes a portion of the film of material that has attained a temperature near its melting point to melt along a relatively narrow region within the film by connecting a second source of high-frequency voltage between two sets of colinear electrodes, parallel to and between the electrodes of the primary heating means with respect to the planar film of material;

causing relative motion between the film of material and the primary and secondary heating means, the direction of relative motion being parallel to the plane of the film of material and perpendicular to the electrodes of the primary and secondary heating means;

altering the chemical potential at the nucleating tip of the ribbon of crystalline material by attaching a fifth electrode to the means for removing heat and a sixth electrode to the film of material at a point where the film is solid, the point being directed away from the melted material in a direction opposite to the direction of motion of the film of material relative to the primary and secondary heating means, and a connecting a dc voltage source between the fifth and sixth electrodes; and controllably removing heat from the melted material in a direction substantially perpendicular to the plane of the film of material by means of a cooling gas.

* * * * *